(12) United States Patent
Schneider (10) Patent No.: US 7,612,694 B1
(45) Date of Patent: Nov. 3, 2009

(54) EFFICIENT CODING OF SMALL INTEGER SETS

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 10 days.

(21) Appl. No.: 12/111,481

(22) Filed: Apr. 29, 2008

(51) Int. Cl.
*H03M 7/34* (2006.01)

(52) U.S. Cl. .......................... 341/51; 341/50

(58) Field of Classification Search ............... 341/51
See application file for complete search history.

(56) References Cited

U.S. PATENT DOCUMENTS

2007/0153013 A1\* 7/2007 Wells et al. ................ 345/549

\* cited by examiner

*Primary Examiner*—Khai M Nguyen
(74) *Attorney, Agent, or Firm*—Blakely, Sokoloff, Taylor & Zafman LLP (57) ABSTRACT

Techniques for coding integer sets are described herein. According to one embodiment, for each data range of parameters to be encoded, a number of bits required to represent a maximum parameter among the parameters in each data range is determined, including a first number of bits and a second number of bits corresponding to the first and second data ranges. Each parameter in the first data range is encoded using the first number of bits and each parameter in the second data range is encoded using the second number of bits, where the data stream further includes a value representing the first number of bits and the data stream is to be decoded by a decoder using the value representing the first number of bits to recover the first number of bits and the second number of bits, which are used to recover each parameter from the data stream.

22 Claims, 5 Drawing Sheets

EFFICIENT CODING OF SMALL INTEGER SETS

TECHNICAL FIELD

The present invention relates generally to data compression. More particularly, this invention relates to methods for efficient coding of small integer sets.

BACKGROUND

Small sets of integers of distinct sizes (e.g., an 8 bit set and a 16 bit set) arise in a variety of computing applications, such as entropy encoders. However, certain conventional methods put requirements on the values, or the relationship between the values, of the integers themselves, or are not quite as efficient.

BRIEF DESCRIPTION OF THE DRAWINGS

The present invention is illustrated by way of example and not limitation in the figures of the accompanying drawings in which like references indicate similar elements.

DETAILED DESCRIPTION

In the following description, numerous details are set forth to provide a more thorough explanation of the embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

According to one embodiment, an encoding method is provided to allow an encoder to code integer sequences without regard to the relationship between the values themselves. As a result, a sequence can be coded where some values repeat and where the values are not non-increasing.

Figure 1:
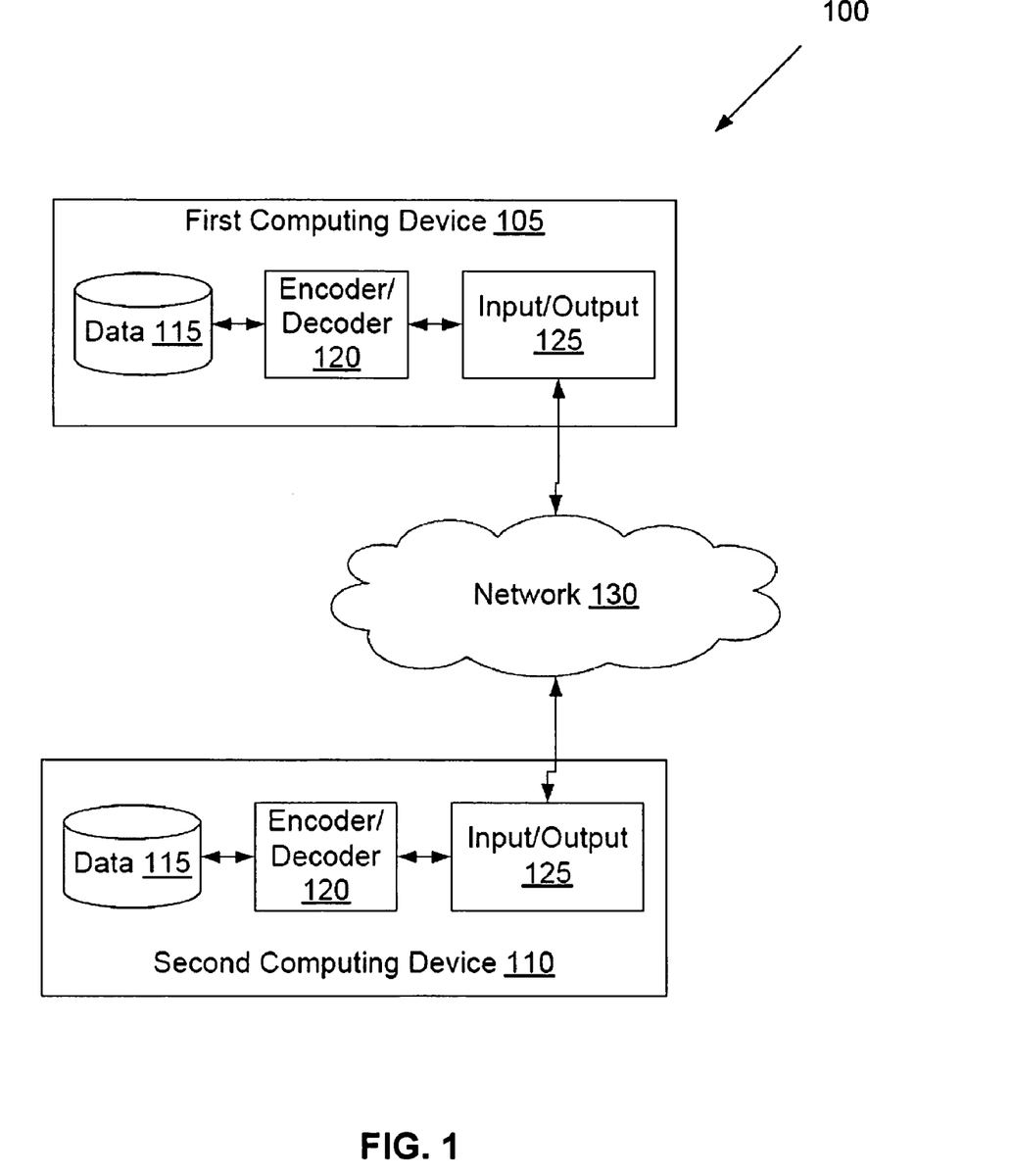
FIG. 1 shows an overview of an adaptive coding compression process according to an embodiment of the invention.

FIG. 1 illustrates an exemplary network architecture 100 in which embodiments of the present invention may operate. The network architecture 100 may include a first computing device 105 and a second computing device 110 connected via a network 130. The network may be a public network (e.g., the Internet) or a private network (e.g., a local area network (LAN), intranet, intraweb, etc.).

Each of the first computing device 105 and second computing device 110 may be a desktop computer, notebook computer, cellular phone, personal digital assistant (PDA), or other device capable of processing machine-executable code. Moreover, the first computing device 105 and second computing device 110 may each operate as a client or server in a client-server environment, or as a peer in a peer-to-peer environment. In one embodiment, the first computing device 105 and second computing device 110 each include data 115, an encoder 120, and an input/output unit 125.

Data 115 may be data of arbitrary size, and may be stored in a storage medium such as a hard disk drive, random access memory (RAM), read only memory (ROM), optical media, magnetic media, etc. Encoder/decoder 120 may be connected with a storage medium that includes data 115. Encoder/decoder 120 may compactly encode data for transmission or storage, and decode received or read data. Encoded data may be transmitted and received using input/output 125, with which encoder/decoder 120 is connected.

According to certain embodiments of the invention, improved methods for coding a set of small integers is provided to further reduce a number of bits for coding the small integers such as parameters.

According to certain embodiments, the basic idea is to arrange the integers into groups by the maximum number of bits required to represent their entire ranges. For example, if you have some integers in the range 0-255, and some in the range 0-65535, you'd have a group of 8-bit integers, and a group of 16-bit integers. Then, determine factors that you can multiply the smallest bit size by to get the larger bit sizes. In this example, that would be 2. In the case of bit sizes of 8, 12, and 16, the factors would be 1.5 and 2 respectively.

Next, take the largest of each group, and determine how many bits you actually need to represent it. Continuing with the example above, if you had values of 8, 17, and 34 for the 8 bit integers group, your maximum value (e.g., 34) takes 6 bits to represent. For a set of 127, 4163, and 1125 for the 16-bit set, your maximum value (e.g., 4163) would take 13 bits to represent.

Then, using the maximum bit sizes for each group (e.g., 6 and 13 in this example), determine how it would be coded, if divided by the factor to scale it from the smallest bit size to its bit size (rounded up). In this example, the 8 bit set takes 6 bits. The 16 bit set, which takes 13 bits, would need 7 (e.g., 13 divided by scaling factor of 2, and rounded up). Then, code the length parameter you just determined (e.g., 7 in this case) using the number of bits you'd need to represent the largest possible value. Since the values in this example would be between 1-8, that requires 3 bits to encode. Finally, code the sets of values themselves, using the encoded number of bits (e.g., 7 bits determined above) for the set of small numbers, and the encoded number of bits multiplied by the scaling factor, rounded up, for each successive set.

For the example above, the 7 comes from dividing the maximum required size of the 16-bit range set (13, for the 13 bits necessary to represent 4163) by the scaling factor (e.g., scaling factor of 2 in this example) between the ranges (e.g., 16 divided 8 is 2), and rounding up. This single value (e.g., 7) would then be used to represent the required number of bits for every integer to be encoded in both sets. For the 8-bit set, it is the exact number of bits (e.g., 7 bits) and for the 16-bit set, it would be multiplied by the scaling factor (e.g., 7*16/8=14), so the second set would be encoded in 14 bits each. The maximum value for the size or length parameter (which would be 8, if there was a value in the first set greater than 127, or a value in the second set greater than 32767) can be represented in 3 bits. So, all seven values (the size parameter, plus the three values from the 8-bit set, plus the three values from the 16-bit set) can be represented in 3+7+7+7+14+14+14=66 bits. Note that a single size parameter is utilized to code multiple sets of integers having different ranges.

According to an alternative embodiment, a different size parameter for each different set may be utilized and coded therein. Referring to the example above, the maximum range of the first size parameter is 1-8, which would take 3 bits to encode. The maximum range of the second size parameter is 1-16, which would take 4 bits to encode. So, if we encode 6 (e.g., the bits needed for the first set), 13 (e.g., the bits needed in the second set), and the six values from both sets, it would take 64 bits (e.g., 3+4+6+6+6+13+13+13). This second method would be more efficient if the sets of values to be encoded could be expected to span different portions of their range (in the example, the first set spans ⅝ of the range, and the second set spans 13/16 of the range). This would make a dramatic difference in the case where the larger range is expected to actually code values that are smaller than the largest value in the smaller range.

For example, to code the sets of 8, 17, and 224 in an 8-bit range, and 105, 32, and 122 in a 16-bit range, the first method would require a size parameter of 8, and the coding would require using 16 bits for each value in the set from the 16-bit range, for a total encoding requiring 75 bits (or three bits more than just encoding the values as integers directly). Using the alternative of the preceding paragraph, each set would have its own size parameter (which would be 8 and 7 respectively), and each size parameter would be independently coded (requiring 3 and 4 bits respectively). Coding the above example using the alternative coding method would require 52 bits (e.g., 3+4+8+8+8+7+7+7) for a savings of 20 bits over a direct coding of the values as integers of 8 and 16 bits.

Note that this encoding method can also expand data. For the example above, using 3 and 4 bits to code the size parameters, this expansion could be as much as 7 bits. Further, the alternative coding may not be useful when there are very few parameters of each size to code. For example, coding an 8-bit parameter 34 and a 16-bit parameter 4153 using the first technique would require 24 bits (3+7+14), while the alternative encoding technique would require 26 (3+4+6+13). A large disparity in the ranges of the parameters can mitigate this disadvantage. For example, if you have an 8-bit parameter 34, and a 32-bit parameter 4153, the first technique would yield a size parameter of 6, requiring 6 bits to encode the parameter value 34, and 24 bits to encode the parameter value 4153. This would lead to an encoding that requires 33 bits (3+6+24). Using the alternative technique, the encoding could be accomplished in 27 bits—3 to encode the size parameter (6) for the first value, 5 to encode the size parameter (13) for the second value, and 6 and 13 bits, respectively, to encode the values themselves.

Note that the scaling factors do not need to be encoded since they are implicit in the implementation. In order to successfully extract the values, an encoder/decoder would need to know how many integers of each range to expect. As a worked out example: encode the set 8, 17, 34, taken from parameters guaranteed to be in the range 0-255, and the set 127, 4163, 1125, taken from parameters in the range 0-65535.

Note that the number and sizes of the parameters are fixed for a given implementation. Thus, an encoder would not need to communicate to a decoder how many values of each size to expect. If the number and/or sizes of the parameters are variable, one may need multiple instances of the coding—one or more to provide a description of the parameters and parameter sets, and one to provide the parameters themselves. For example, for an application that can present any number of sets of parameters of any size up to 256 bits each, one would need an encoding for the number and size of the parameter description values, an encoding of the parameter description values themselves, and the parameters themselves.

For another example, an application has generated three sets of parameters: the 8-bit set 33, 18, and 109, the 16 bit set 4215, and 30877, and the 32 bit set 86573, 100148, 3276, and 651. These sets could be described with the parameters 8, 3, 16, 2, 32, 4 (e.g., sizes followed by number of entries). The description set itself could be described with the parameters 3, 32 (e.g., the number of parameter pairs, and the maximum bit size). This description parameter set would be two 8-bit values (since it is assumed that the values will all be 256 bit size or less). Coding 3, 32 as 8-bit values would take 3+6+6=15 bits.

The description parameters themselves fall into two size groups—one for the number of parameters, and one for their sizing. The sizing parameters (8, 16, and 32) would be in an 8-bit sized set. The set count parameters (3, 2, and 4) would be in a set whose size is determined by what it means by "any number of parameters". If one thinks 256 is a reasonable parameter set size, this would be an 8-bit sized set, too. So, the parameter descriptions could be coded in 3+6+6+6+6+6=39 bits.

Finally, to encode the parameters themselves, using the first method, one would have a size parameter of 8, and then three 8-bit, two 16-bit, and four 32-bit values, for a total of 187 bits, plus the additional 15+39 bits. Using the alternative coding, one would have size parameters of 6, 15, 17, taking 3+4+5=12 bits to encode, plus 3 6-bit, 2 15-bit, and 5-17 bit values, for a total of 145 bits, plus the additional 15+39 bits.

Figure 2:
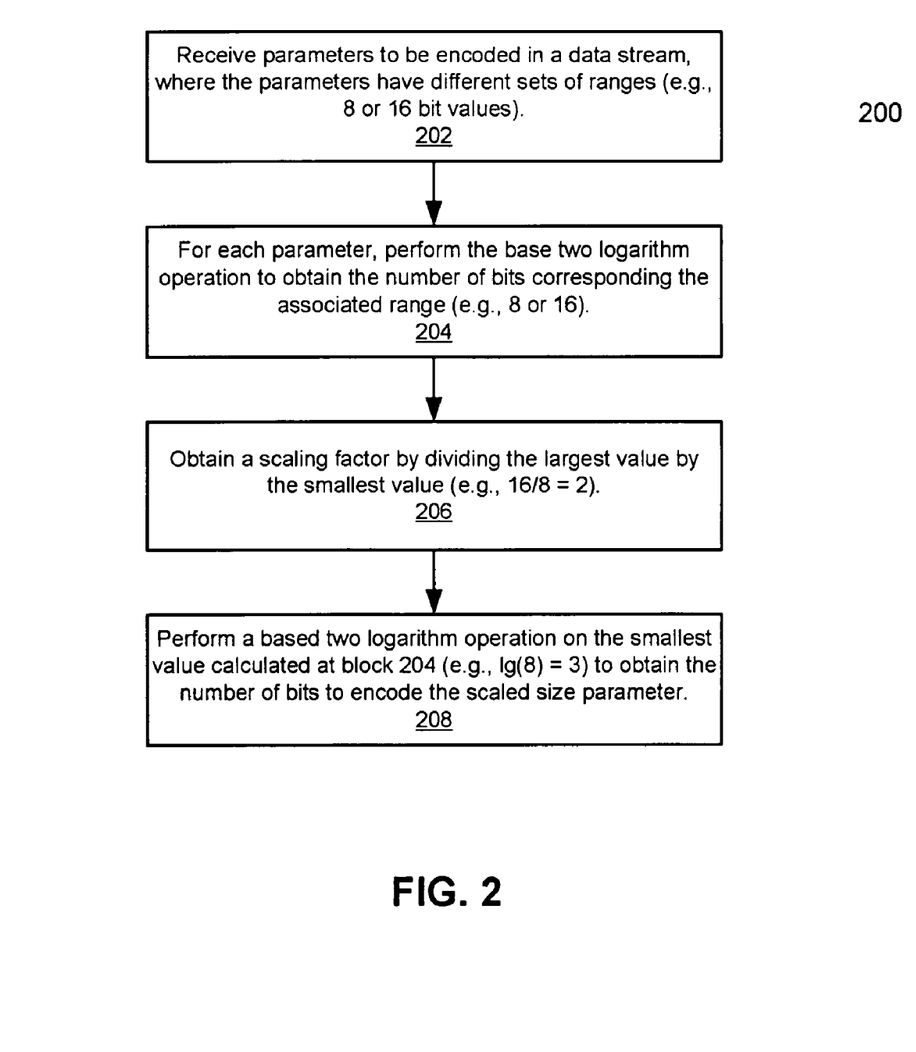
FIG. 2 is a flow diagram illustrating a process for deriving coding parameters from sizes of various parameter sets according to an embodiment of the invention.

FIG. 2 is a flow diagram illustrating a pre-process for encoding a set of integers according to one embodiment of the invention. Process 200 may be performed by an encoder which may be implemented in software, hardware, or a combination of both. For example, process 200 may be performed by encoder 120 of FIG. 1. When a set of parameters is received to encoded at block 202, processing logic performs a base two logarithm of each set's range (that would be 8 and 16, respectively, for this example) at block 204. At block 206, processing logic divides the larger logarithm (e.g., 16) by the smaller (e.g., 8) to obtain a scaling factor (16/8==2, in this example). If there are more than two sets, multiple scaling factors may be needed. At block 208, processing logic performs the base two logarithm of the smallest logarithm computed at block 204 (that would be lg(8)==3). This is the number of bits the encoder will need to encode the scaling parameter. Note that process 200 is a preprocess prior to the actual encoding process and would be performed only once during the implementation.

Figure 3:
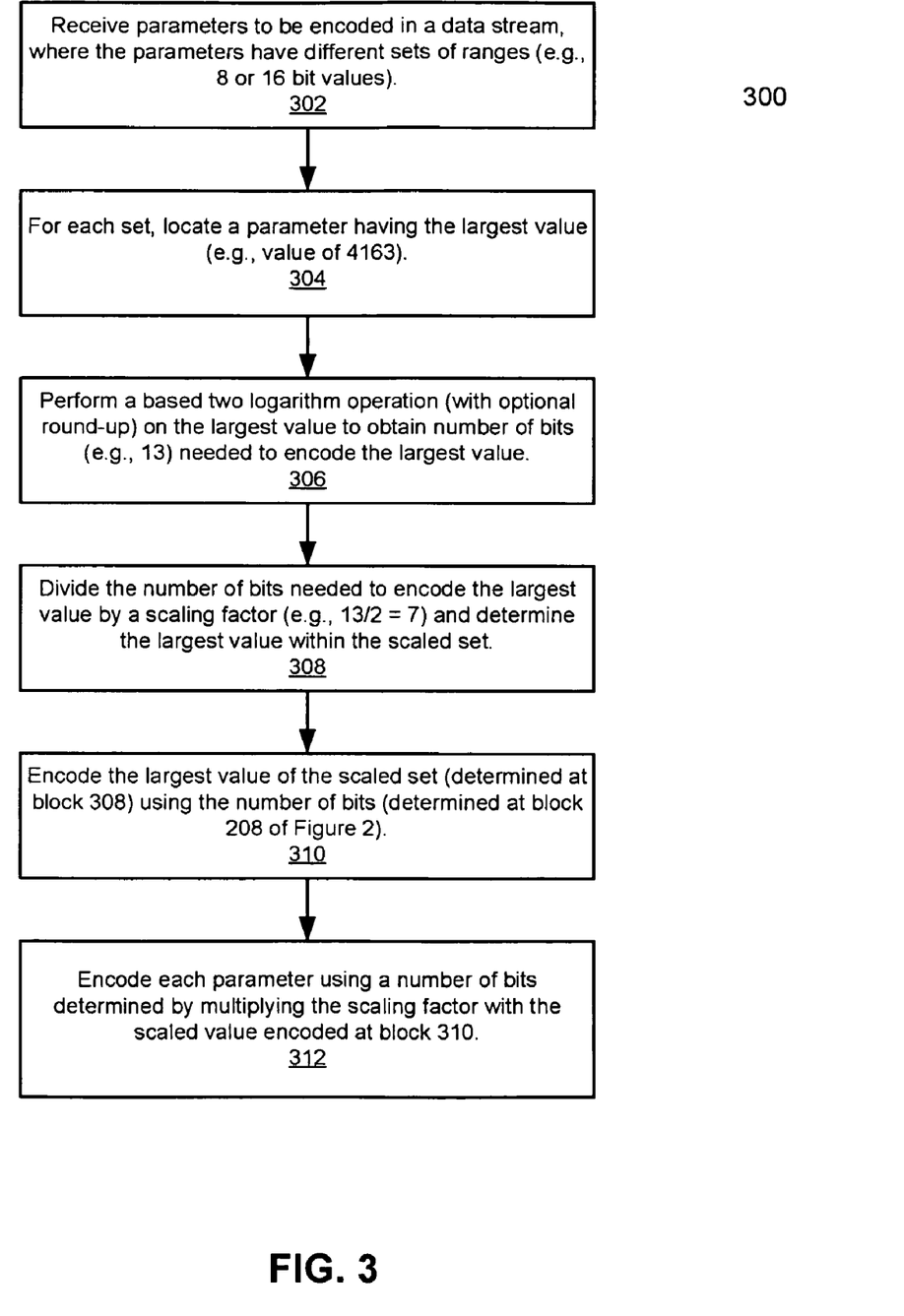
FIG. 3 is a flow diagram illustrating an encoding process according to one embodiment of the invention.

FIG. 3 is a flow diagram illustrating an encoding process according to one embodiment of the invention. Process 300 may be performed by an encoder which may be implemented in software, hardware, or a combination of both. For example, process 300 may be performed by encoder 120 of FIG. 1. Referring to FIG. 3, at block 302, a set of parameters is received to be encoded in a data stream, where the parameters include different sets of ranges (e.g., 8 bits vs. 16 bits). At block 304, processing logic finds the largest value in each set. In the above example, that is 34 for the 8-bit set and 4163 for the 16-bit set. This can be determined efficiently by finding the bit position of the highest set bit in the binary representation of the value. Following pseudo code may be used to locate a bit position of the highest set bit:

```
int find_hibit (unsigned long value)
{
int rv=0;
int bitcount=sizeof (unsigned long)/2;
unsigned long mask=(~((unsigned long)0))<<bitcount;
```

```
if(!value)
   return 0;
while(bitcount>=1)
{
  if(mask & value)
  {
    rv+=bitcount;
    value>>=bitcount;
  }
  bitcount>>=1;
  mask>>=bitcount;
}
return rv+1;
}
```

At block 306, processing logic takes the base two logarithm, rounded up, of each value found in block 304. This is the number of bits required to encode the values (e.g., 6 and 13 respectively). In one embodiment, this can be determined efficiently by finding the bit position of the highest set bit in the binary representation of the value. For example, on a 32 bit machine, this can be done using pseudo code as shown in FIG. 2. At block 308, processing logic divides the logarithms of the higher range sets by the scaling factors, rounding up. In this example, it would be ceil(13/2)==7). Processing logic further finds the largest value in the set of scaled logarithms. Note that the logarithm for the smallest set is implicitly scaled by 1, where in this example, the largest value is 7. At block 310, processing logic encodes the value derived in block 308 (e.g., largest value of 7) in the number of bits determined in the pre-encoding process (e.g., block 208 of FIG. 2). In one embodiment, the encoding will be biased by 1 to encode the entire range (e.g., 7 would be coded as 110). Alternately, the largest possible value would be encoded as the all zero bit string. At block 312, for each value to encode, processing logic multiplies the parameter from block 308 by the scaling factor appropriate for the set it belongs to, and encode the value in that many bits determined at block 306 (e.g., for the 8 bit set, that would be 7, and for the 16 bit set, that would be 14).

The example sets of "8, 17, 34, 127, 4163, and 1125" would result in the following encoding:

| size | 8 | 17 | 34 | 127 | 4163 | 1125 |
|---|---|---|---|---|---|---|
| 110 | 0001000 | 0010001 | 0100010 | 00000001111111 | 01000001000011 | 00010001100101 |

To decode, a decoder would need to know the order in which the values are presented. For example, a decoder needs to know the ordering of the scaling factors used for the values, which would be 1, 1, 1, 2, 2, 2 for this example and the logarithm calculated as discussed in pre-encoding process block 208 of FIG. 2. Again, this information can be preassumed and/or fixedly agreed upon between an encoder and a decoder.

Figure 4:
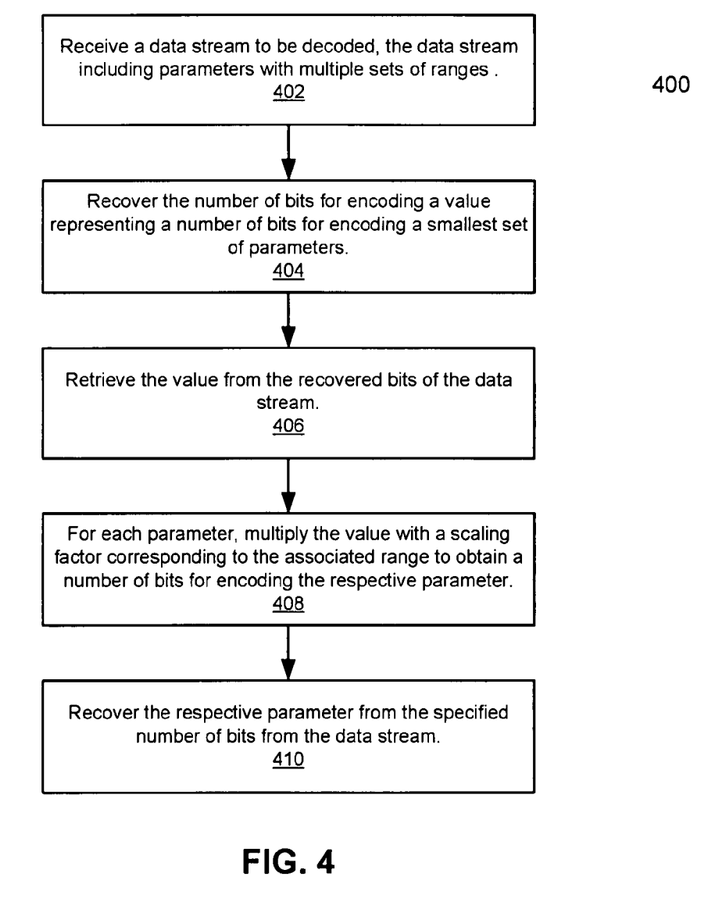
FIG. 4 is a flow diagram illustrating a decoding process according to one embodiment of the invention.

FIG. 4 is a flow diagram illustrating a decoding process according to one embodiment of the invention. Process 400 may be performed by an encoder which may be implemented in software, hardware, or a combination of both. For example, process 400 may be performed by decoder 120 of FIG. 1. Referring to FIG. 4, at block 402, a data stream is received to be decoded, where the data stream includes parameters having multiple sets of different ranges. At block 404, processing logic recovers the number of bits specified by the logarithm calculated in block 208 of FIG. 2 (e.g., the three bits encoding 110 in the above example) and converts this to an integer and add one (e.g., 6+1==7) at block 406. For each value, at block 408, processing logic multiplies the recovered value (e.g., 7) by the scaling factor (e.g., 1 or 2) appropriate for the particular position. At block 410, processing logic recovers that many bits from the data stream and converts the bit string to an integer of the appropriate size. For the example, the calculated values would be 7, 7, 7, 14, 14, 14, and the bit strings would be pulled off from the data stream as appropriate.

Figure 5:
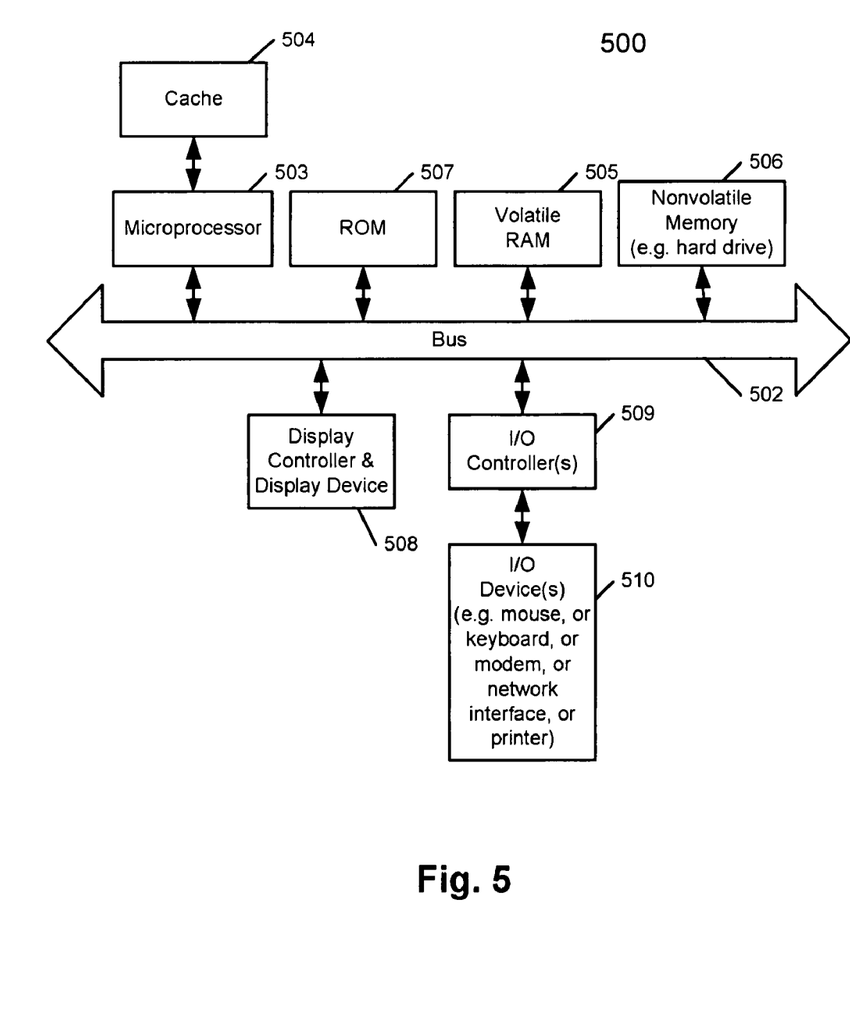
FIG. 5 is a block diagram illustrating an example of a data process system which may be used with one embodiment of the invention.

FIG. 5 illustrates a diagrammatic representation of a machine in the exemplary form of a computer system within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. For example, the system 500 may be used as part of system, either an encoder or a decoder, to perform the coding processes set forth above.

As shown in FIG. 5, the system 500, which is a form of a data processing system, includes a bus or interconnect 502 which is coupled to one or more microprocessors 503 and a ROM 507, a volatile RAM 505, and a non-volatile memory 506. The microprocessor 503 is coupled to cache memory 504 as shown in the example of FIG. 5. Processor 503 may be, for example, a PowerPC microprocessor or an Intel compatible processor. Alternatively, processor 503 may be a digital signal processor or processing unit of any type of architecture, such as an ASIC (Application-Specific Integrated Circuit), a CISC (Complex Instruction Set Computing), RISC (Reduced Instruction Set Computing), VLIW (Very Long Instruction Word), or hybrid architecture, although any appropriate processor may be used.

The bus 502 interconnects these various components together and also interconnects these components 503, 507, 505, and 506 to a display controller and display device 508, as well as to input/output (I/O) devices 510, which may be mice, keyboards, modems, network interfaces, printers, and other devices which are well-known in the art.

Typically, the input/output devices 510 are coupled to the system through input/output controllers 509. The volatile RAM 505 is typically implemented as dynamic RAM (DRAM) which requires power continuously in order to refresh or maintain the data in the memory. The non-volatile memory 506 is typically a magnetic hard drive, a magnetic optical drive, an optical drive, or a DVD RAM or other type of memory system which maintains data even after power is removed from the system. Typically, the non-volatile memory will also be a random access memory, although this is not required.

While FIG. 5 shows that the non-volatile memory is a local device coupled directly to the rest of the components in the data processing system, embodiments of the present invention may utilize a non-volatile memory which is remote from the system; such as, a network storage device which is coupled to the data processing system through a network interface such as a modem or Ethernet interface. The bus 502 may include one or more buses connected to each other through various bridges, controllers, and/or adapters, as is well-known in the art. In one embodiment, the I/O controller 509 includes a USB (Universal Serial Bus) adapter for controlling USB peripherals. Alternatively, I/O controller 509 may include an IEEE-1394 adapter, also known as FireWire adapter, for controlling FireWire devices.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A computer implemented method for encoding a set of integers, the method comprising:
receiving a plurality of parameters to be encoded in a data stream, the plurality of parameters including integer data values in a plurality of data ranges, including a first data range and a second data range greater than the first data range;
for each data range, determining a number of bits required to represent a parameter having a maximum value among parameters in each data range, including a first number of bits and a second number of bits corresponding to the first and second data ranges; and
encoding into the data stream each parameter in the first data range using the first number of bits and each parameter in the second data range using the second number of bits, the data stream further including a value representing the first number of bits, wherein the data stream is to be decoded by a decoder using the value representing the first number of bits to recover the first number of bits and the second number of bits via a scaling factor between the first and second numbers of bits, which are used to recover each parameter from the data stream.

2. The method of claim 1, wherein determining a number of bits required to represent a parameter having a maximum value comprises:
performing a base-two logarithm operation on the parameter having the maximum value in each data range, generating a first logarithm output; and
rounding up the first logarithm output to obtain an integer value representing the number of bits required to represent the parameter having the maximum value, wherein the integer value is at least as large as the first logarithm output.

3. The method of claim 2, further comprising:
determining a third number of bits to represent the value representing the first number of bits by performing a base-two logarithm operation on the value representing the first number of bits; and
encoding into the data stream the value representing the first number of bits using the third number of bits.

4. The method of claim 3, further comprising determining the scaling factor by dividing the second number of bits over the first number of bits, wherein during decoding, the second number of bits is recovered by multiplying the first number of bits recovered from the data stream with the scaling factor.

5. The method of claim 4, wherein the value representing the first number of bits is recovered from the data stream during the decoding, wherein each parameter associated with the first data range is recovered from the data stream from a location determined by the first number of bits, and wherein each parameter associated with the second data range is recovered from the data stream from a location determined by the first number of bits multiplied by the scaling factor.

6. The method of claim 3, further comprising:
   determining a fourth number of bits to represent a value representing the second number of bits by performing a base-two logarithm operation on the value representing the second number of bits; and
   encoding into the data stream the value representing the second number of bits using the fourth number of bits, wherein the data stream is decoded using the values representing the first number of bits and the second number of bits.

7. The method of claim 1, wherein the first number of bits is less than a number of bits required to encode a maximum value associated with the first data range, and wherein the second number of bits is less than a number of bits required to encode a maximum value associated with the second data range.

8. A computer readable medium including instructions that, when executed by a processing system, cause the processing system to perform a method for encoding a set of integers, the method comprising:
   receiving a plurality of parameters to be encoded in a data stream, the plurality of parameters including integer data values in a plurality of data ranges, including a first data range and a second data range greater than the first data range;
   for each data range, determining a number of bits required to represent a parameter having a maximum value among parameters in each data range, including a first number of bits and a second number of bits corresponding to the first and second data ranges; and
   encoding into the data stream each parameter in the first data range using the first number of bits and each parameter in the second data range using the second number of bits, the data stream further including a value representing the first number of bits, wherein the data stream is to be decoded by a decoder using the value representing the first number of bits to recover the first number of bits and the second number of bits via a scaling factor between the first and second numbers of bits, which are used to recover each parameter from the data stream.

9. The computer readable medium of claim 8, wherein determining a number of bits required to represent a parameter having a maximum value comprises:
   performing a base-two logarithm operation on the parameter having the maximum value in each data range, generating a first logarithm output; and
   rounding up the first logarithm output to obtain an integer value representing the number of bits required to represent the parameter having the maximum value, wherein the integer value is at least as large as the first logarithm output.

10. The computer readable medium of claim 9, wherein the method further comprises:
    determining a third number of bits to represent the value representing the first number of bits by performing a base-two logarithm operation on the value representing the first number of bits; and
    encoding into the data stream the value representing the first number of bits using the third number of bits.

11. The computer readable medium of claim 10, wherein the method further comprises determining the scaling factor by dividing the second number of bits over the first number of bits, wherein during decoding, the second number of bits is recovered by multiplying the first number of bits recovered from the data stream with the scaling factor.

12. The computer readable medium of claim 11, wherein the value representing the first number of bits is recovered from the data stream during the decoding, wherein each parameter associated with the first data range is recovered from the data stream from a location determined by the first number of bits, and wherein each parameter associated with the second data range is recovered from the data stream from a location determined by the first number of bits multiplied by the scaling factor.

13. The computer readable medium of claim 10, wherein the method further comprises:
    determining a fourth number of bits to represent a value representing the second number of bits by performing a base-two logarithm operation on the value representing the second number of bits; and
    encoding into the data stream the value representing the second number of bits using the fourth number of bits, wherein the data stream is decoded using the values representing the first number of bits and the second number of bits.

14. The computer readable medium of claim 8, wherein the first number of bits is less than a number of bits required to encode a maximum value associated with the first data range, and wherein the second number of bits is less than a number of bits required to encode a maximum value associated with the second data range.

15. A computer implemented method for decoding data, the method comprising:
    receiving a data stream having a plurality of parameters encoded therein, the plurality of parameters including values in a plurality of data ranges including a first data range and a second data range;
    determining a number of bits for encoding a value representing a first number of bits, the first number of bits being required to encode a parameter having a maximum value among parameters in the first data range;
    recovering the value representing the first number of bits from the data stream at a location indicated by the determined number of bits for encoding the value; and
    recovering from the data stream each parameter associated with the first data range at a location determined by the first number of bits and each parameter associated with the second data range at a location determined by the first number of bits and a scaling factor between the first number of bits and a second number of bits required to encode a parameter having a maximum value in the second data range.

16. The method of claim 15, wherein a parameter in the second data range is recovered at a location determined by the second number of bits which is calculated by multiplying the first number of bits with the scaling factor.

17. The method of claim 15, wherein the first number of bits is less than a number of bits required to encode a maximum value associated with the first data range, and wherein the second number of bits is less than a number of bits required to encode a maximum value associated with the second data range.

18. The method of claim 15, further comprising recovering a value representing the second number of bits from the data stream to determine the second number of bits, wherein parameters associated with the second data range are recovered based on the second number of bits derived from the value representing the second number of bits from the data stream without using the scaling factor.

19. A computer readable medium including instructions that, when executed by a processing system, cause the processing system to perform a method for decoding data, the method comprising:

receiving a data stream having a plurality of parameters encoded therein, the plurality of parameters including values in a plurality of data ranges including a first data range and a second data range;

determining a number of bits for encoding a value representing a first number of bits, the first number of bits being required to encode a parameter having a maximum value among parameters in the first data range;

recovering the value representing the first number of bits from the data stream at a location indicated by the determined number of bits for encoding the value; and recovering from the data stream each parameter associated with the first data range at a location determined by the first number of bits and each parameter associated with the second data range at a location determined by the first number of bits and a scaling factor between the first number of bits and a second number of bits required to encode a parameter having a maximum value in the second data range.

20. The computer readable medium of claim 19, wherein a parameter in the second data range is recovered at a location determined by the second number of bits which is calculated by multiplying the first number of bits with the scaling factor.

21. The computer readable medium of claim 19, wherein the first number of bits is less than a number of bits required to encode a maximum value associated with the first data range, and wherein the second number of bits is less than a number of bits required to encode a maximum value associated with the second data range.

22. The computer readable medium of claim 19, wherein the method further comprises recovering a value representing the second number of bits from the data stream to determine the second number of bits, wherein parameters associated with the second data range are recovered based on the second number of bits derived from the value representing the second number of bits from the data stream without using the scaling factor.

* * * * *